US 9,958,481 B2

(12) United States Patent
Gerkens et al.

(10) Patent No.: US 9,958,481 B2
(45) Date of Patent: May 1, 2018

(54) CURRENT TRANSFORMER AND METHOD FOR CONVERTING A CONDUCTOR CURRENT FLOWING IN AN ELECTRICAL CONDUCTOR TO AN OUTPUT SIGNAL

(71) Applicant: Weidmueller Interface GmbH & Co. KG, Detmold (DE)

(72) Inventors: Michael Gerkens, Bielefeld (DE); Christian Heggemann, Detmold (DE); Hans Schlingmann, Horn-Bad Meinberg (DE)

(73) Assignee: Weidmueller Interface GmbH & CO. KG (DE)

( * ) Notice: Subject to any disclaimer, the term of this patent is extended or adjusted under 35 U.S.C. 154(b) by 0 days. days.

(21) Appl. No.: 14/773,380

(22) PCT Filed: Mar. 31, 2014

(86) PCT No.: PCT/EP2014/056483
§ 371 (c)(1),
(2) Date: Sep. 7, 2015

(87) PCT Pub. No.: WO2014/161826
PCT Pub. Date: Oct. 9, 2014

(65) Prior Publication Data
US 2016/0018444 A1    Jan. 21, 2016

(30) Foreign Application Priority Data

Apr. 4, 2013    (DE) .................... 10 2013 103 350

(51) Int. Cl.
*G01R 15/20*    (2006.01)
*G01R 33/07*    (2006.01)
(Continued)

(52) U.S. Cl.
CPC ........... *G01R 15/202* (2013.01); *G01R 15/18* (2013.01); *G01R 19/02* (2013.01); *H01F 38/40* (2013.01);
(Continued)

(58) Field of Classification Search
CPC ....... G01R 15/202; G01R 15/18; G01R 19/02; G01R 19/2509; H01F 38/40; H02M 2001/0009
(Continued)

(56) References Cited

U.S. PATENT DOCUMENTS 6,433,981 B1 *  8/2002  Fletcher ............. G01R 19/0092
                                                323/234
9,335,352 B2 *  5/2016  McCrea ................ G01R 21/06
(Continued)

FOREIGN PATENT DOCUMENTS

CN         201497766 U    6/2010
DE    10 2008 043 799 A1  5/2010
EP          1 215 504 A2   6/2002

OTHER PUBLICATIONS

Texas Instruments: High-Voltage Signal Conditioning for Low-Voltage ADC's 655303 Dallas, Texas 75265, U.S. (Application Report SBOA097 by Pete Wilson, Jun. 2004).
(Continued)

*Primary Examiner* — Giovanni Astacio-Oquendo
(74) *Attorney, Agent, or Firm* — Laubscher, Spendlove & Laubscher, P.C.

(57) ABSTRACT

A current transformer arrangement, and method, include a current sensor for producing a sensor output voltage that is proportional to the input current flowing in a conductor; a first processing branch including a voltage calculating device for calculating the effective voltage value of the sensor output voltage; a second processing branch including
(Continued)

a polarity detecting device having an input terminal connected with the current sensor output terminal to produce a polarity signal having one polarity when the conductor input current is either an alternating current, a hybrid current, or a direct current flowing in one direction, and the opposite polarity when the conductor input current is a direct current flowing in the opposite direction; and a multiplier device for modifying the effective voltage value to produce a signed effective voltage having a polarity corresponding with the polarity of the polarity signal. A modifying circuit modifies the signed effective voltage.

18 Claims, 3 Drawing Sheets

(51) Int. Cl.
  *G01R 19/02* (2006.01)
  *G01R 15/18* (2006.01)
  *H01F 38/40* (2006.01)
  *G01R 19/25* (2006.01)
  *H02M 1/00* (2006.01)

(52) U.S. Cl.
  CPC . *G01R 19/2509* (2013.01); *H02M 2001/0009* (2013.01)

(58) Field of Classification Search
  USPC .................... 324/117 H, 76.11, 76.29, 76.41
  See application file for complete search history.

(56) References Cited

U.S. PATENT DOCUMENTS

| | | | |
|---|---|---|---|
| 2006/0226826 A1* | 10/2006 | Teppan | G01R 15/202 324/117 H |
| 2009/0085573 A1* | 4/2009 | Blakely | G01R 15/202 324/509 |
| 2014/0214218 A1* | 7/2014 | Eldridge | G01D 4/002 700/286 |
| 2014/0253102 A1* | 9/2014 | Wood | G01R 1/203 324/140 R |

OTHER PUBLICATIONS

Lem, "Current transducer FHS 40-P/SP600 IPM=0-100 A Minisens," Dec. 31, 2007, pp. 1-18, <<www.lem.com>>.
Lem, "CAS/CASR/CKSR series Current Transducers Insulated Highly Accurate Measurements from 1.5 to 50 ARMS," Jun. 2, 2010, pp. 1-24, <<www.digikey.com>>.
Lem, New Miniaturized Transducers for PCB-based Current Measurement, Dec. 31, 2007, pp. 36-37, <<www.lem.com>>.
Office Action, Chinese Patent Application No. CN201480019641. X, Weidmüller Interface GmbH & Co. KG (Gerkins, Michael), Apr. 1, 2017.

* cited by examiner

CURRENT TRANSFORMER AND METHOD FOR CONVERTING A CONDUCTOR CURRENT FLOWING IN AN ELECTRICAL CONDUCTOR TO AN OUTPUT SIGNAL

REFERENCE TO RELATED APPLICATIONS

This application is a national stage application under 35 C.F.R. § 371 of the PCT International Application No. PCT/EP2014/056483 filed Mar. 31, 2014, which claims priority of the German application No. DE 10 2013 350.4 filed Apr. 4, 2013.

BACKGROUND OF THE INVENTION

Field of the Invention

The present invention relates to a current transformer with a current sensor for determining an effective value of a conductor current. The invention furthermore concerns a method for converting a conductor current flowing in an electrical conductor into an output signal.

Description of Related Art

Current transformers are used to measure a usually large conductor current flowing through a conductor. They deliver an output signal—either an output voltage signal or an output current signal—which is linear to the conductor current being measured.

Current transformers are known in which the conductor circuit being measured is coupled to the output circuit by means of a magnetically conducting (iron) core through which both circuits pass. As the current varies in the circuit being measured, the magnetic field in the core produced by the conductor current varies. This induces a voltage in the output circuit which is detected. However, the current detection by induction only allows for the detecting of alternating currents in the circuit being measured.

In contrast to this, direct currents can also be detected with current transformers which work with current sensors, such as a Hall effect sensor or a shunt resistor. A Hall effect sensor for example is positioned in a magnetic field produced by the conductor current being measured, and the magnetic flux of the magnetic field is detected. After an offset correction which may be necessary, an output voltage put out by the Hall effect sensor is proportional to the magnetic flux and thus to the conductor current. Such a measurement is done, for example, with a clip-on ammeter, which encloses the conductor through which the current is flowing. In the case of a shunt resistor used as current sensor, the conductor current being measured flows directly through the shunt, and the voltage drop across it is measured.

The output voltage delivered by the current sensor is a signed value, where the sign indicates the current direction. In current transformers which are designed to measure alternating currents, an effective value (RMS—Root Mean Square) of the output voltage of the current sensor is formed and thus an output signal is put out which is linear to the effective value of the conductor current.

In the current transformers of the prior art, owing to the forming of the effective value, such current transformers are unipolar in design. Therefore, the measurement of a direct current (DC—Direct Current) $I_{DC\_LOAD}$ as a conductor current always furnishes a positive output signal, regardless of the direction of the conductor current.

In addition, current transformers are known for measurement of direct currents in which the direction of the direct current is represented in the output signal. Such transformers are also known as bipolar current transformers. However, with these transformers a measurement of alternating currents is not possible. Depending on the reaction time of the current transformer, an alternating current flowing in the conductor either results in an output signal corresponding to a current strength of zero or an output signal alternating with the frequency of the alternating current.

The present invention was developed to create a current transformer with a current sensor which is suitable both for a current transformation of an input-side alternating current, and an input-side direct current as well as a hybrid current, and in which the direction of the input-side direct current is identifiable.

SUMMARY OF THE INVENTION

Accordingly, a primary object of the invention is to provide a current transformer arrangement, including a current sensor for producing a sensor output voltage that is proportional to the input current flowing in a conductor; a first processing branch including a voltage calculating device for calculating the effective voltage value of the sensor output voltage; a second processing branch including a polarity detecting device having an input terminal connected with the current sensor output terminal to produce a polarity signal having one polarity when the conductor input current is either an alternating current, a hybrid current, or a direct current flowing in one direction, and the opposite polarity when the conductor input current is a direct current flowing in the opposite direction; and a multiplier device for modifying the effective voltage value to produce a signed effective voltage having a polarity corresponding with the polarity of the polarity signal. A modifying circuit modifies the signed effective voltage for use by an automation control system.

According to a more specific object of the invention, a current transformer is provided having a current sensor which converts a conductor current flowing in an electrical conductor into an output voltage proportional to the conductor current. The current transformer is characterized in that it comprises a first processing branch in which a means is provided for calculating the effective value of the output voltage, as well as a second processing branch in which a means is provided for detecting a polarity of the output voltage.

Thanks to the independent detecting of effective value and polarity, the current transformer is suitable both for the detecting of an alternating current flowing in the electrical conductor and for the detecting of a direction of a direct current flowing in the electrical conductor.

The first processing branch preferably comprises a first frequency filter. Preferably, the first frequency filter filters out high-frequency interference signals, and therefore it has a high cut-off frequency. Especially preferably, the frequency range of the first frequency filter is adjustable. One can therefore set it so that the means of detecting the effective value of the output voltage is used for an effective value measurement, which basically detects sinusoidal alternating currents, or for a true effective value measurement, which also detects distorted alternating currents.

Likewise preferably the second processing branch comprises a second frequency filter. The second frequency filter is preferably designed to smooth out the output signal. Preferably it filters out not only high-frequency but also low-frequency components on the order of the mains frequency of 50-60 Hz. Therefore, a filtered output signal is provided to the means for detecting the direction of the output signal, from which the alternating current component has been filtered out in the conductor current.

Furthermore it is preferable for the processing of hybrid currents to multiply the effective value calculated with the means for calculating the effective value of the output voltage depending on the polarity of the output voltage with a positive or negative factor, such as +1 or −1. The means of detecting a polarity of the output voltage is preferably arranged so that it signals a positive polarity for a pure alternating current as the conductor current. Accordingly, a factor of +1 is then multiplied on the effective value.

Moreover, it is preferable to convert the signed effective value in an output circuit into an output signal. Preferable as the output signal is a voltage or a current.

The output circuit preferably comprises a means of adding an offset value and/or a means of scaling the output signal. Further adaptations of the output signal can also be provided, such as a frequency filter or the like.

Insofar as an offset value is added to the signed effective value, the output signal is the offset value for a conductor current of 0 A flowing in the electrical conductor.

Based on the detection of the polarity of the output voltage, the output current for the direct current component of the conductor current flowing in the negative direction is smaller than the offset value, and for the direct current component of the conductor current flowing in the positive direction it is larger than the offset value.

Especially preferably, the offset value is larger than half of a value region being plotted. For example, if the conductor current is being plotted onto an output current in the value region of −8 mA≤$I_{OUT}$≤+8 mA, it is preferable to use an offset value which is larger than 8 mA. Especially preferably, a base value is added to the half value region being plotted. In the mentioned value region, the base value amounts to 4 mA, for example, and the offset value is then 12 mA. In this way, the output signal is positive.

In a method according to the present invention for converting a conductor current flowing in an electrical conductor into an output signal, a current sensor is used for detecting the conductor current, wherein the effective value of the output voltage of the current sensor is calculated and the polarity of the output voltage of the current sensor is detected, the calculated effective value is multiplied, depending on the polarity detected, with a positive or a negative factor to form a signed effective value and an output signal is produced corresponding to the signed effective value.

The signed effective value so calculated is proportional in its absolute magnitude to the conductor current flowing in the electrical conductor. The signed effective value is preferably put out scaled as the output signal of the current transformer, that is, multiplied by a scaling factor, and/or with an offset value added to it.

In one preferred embodiment, the scaled signed effective value and/or the signed effective value superimposed with the offset value is put out as the output signal of the current transformer. In this embodiment, the output signal is an output voltage. Alternatively, the scaled signed effective value and/or the signed effective value superimposed with the offset value is converted into an output current and put out.

BRIEF DESCRIPTION OF THE DRAWINGS

Other objects and advantages of the invention will become apparent from a study of the following specification, when viewed in the light of the accompanying drawing, in which.

DETAILED DESCRIPTION OF THE INVENTION

Figure 1A:
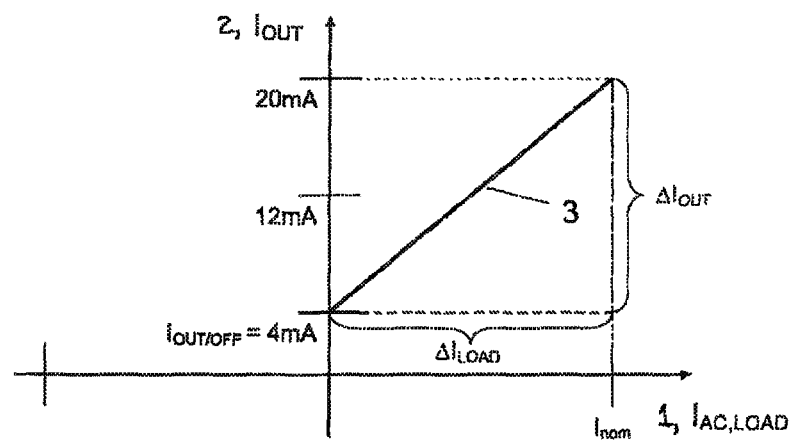
FIG. 1a is a graphic representation of the transfer characteristic of a current transformer system of the Prior Art for measuring an alternating current flowing in a conductor.

Referring first to FIG. 1a, a transfer characteristic 3 is illustrated for a current transformer of the Prior Art for measuring the value of an alternating current flowing in a conductor. On the x-axis is plotted the conductor current value $I_{AC,LOAD}$ in Amperes (A), and on the y-axis is shown the output signal of an output current value $I_{out}$ in Milliamperes (mA). The output current is proportional to the effective value of the conductor current $I_{AC,LOAD}$ which produces the magnetic field in a Hall effect sensor, with a scaling factor $k=\Delta I_{OUT}/\Delta I_{AC,LOAD}$. Furthermore, an offset value $I_{AC,OUT/OFF}$ is superimposed on the output current, so that for a conductor current of 0 A, a measurable output current flows, being here 4 mA.

Figure 1B:
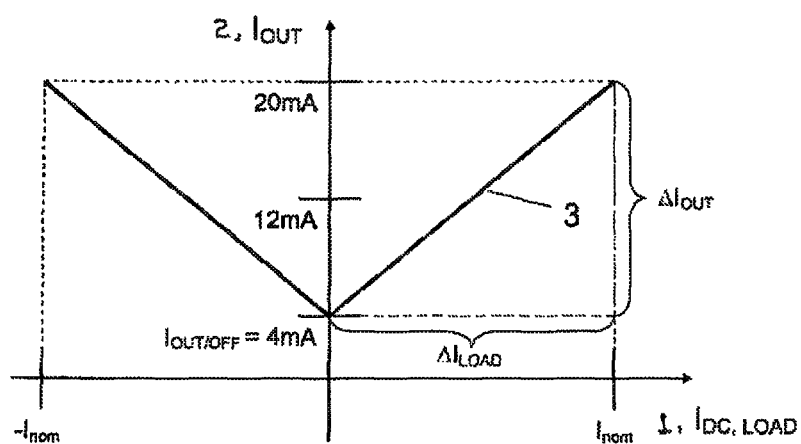
FIG. 1b is a graphic representation of the transfer characteristic of a Prior Art current transformer system for measuring direct current flowing in a conductor.

Owing to the forming of the effective value, such current transformers are unipolar in design. Therefore, as shown in FIG. 1b, the measurement of a direct current $I_{DC,LOAD}$ as a conductor current always furnishes a positive output signal, regardless of the direction of the conductor current.

Figure 2:
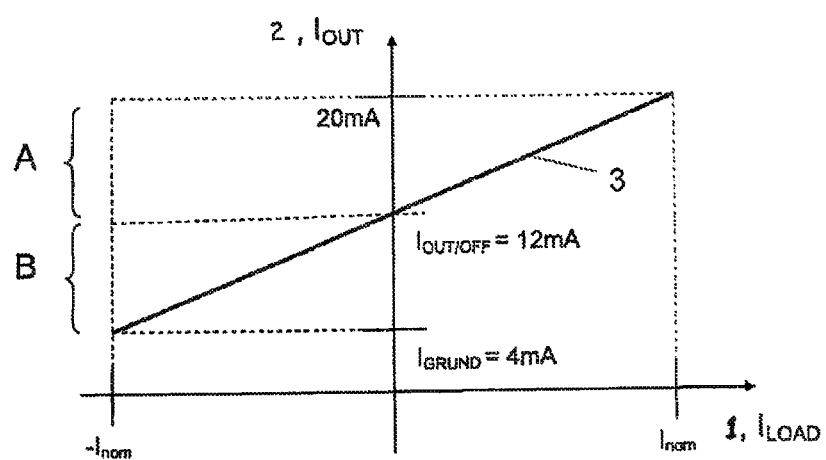
FIG. 2 is a graphic representation of the transfer characteristic of the current transfer system of the present invention.

FIG. 2 shows a transfer characteristic 3 of a current transformer 100 according to the present invention. On the x-axis is plotted the conductor current 1, $I_{LOAD}$ in Ampere (A), on the y-axis is shown as the output signal 2 an output current 2, $I_{out}$ in Milliamperes (mA). The output current 2, $I_{out}$ is proportional to an effective value of the conductor current 1, $I_{LOAD}$. It is weighted with the scaling factor $k=\Delta I_{out}/\Delta I_{LOAD}$ in analogous fashion to the output current value 2, $I_{OUT}$ of the current transformer known from the prior art (see FIG. 1(a)). Furthermore, the output current 2, $I_{OUT}$ is likewise superimposed by an offset value 6, $I_{OUT/OFF}$, so that for a conductor current 1, $I_{LOAD}$ of 0 A, there flows a measurable output current 2, $I_{OUT}$.

The offset value 6, $I_{OUT/OFF}$ here is composed of a base value $I_{GRUND}$, which corresponds here to the offset value 6 of a traditional current transformer (see. FIG. 1(a)) of 4 mA for example, plus the half value range being plotted:

$$I_{OUT/OFF}=I_{GRUND}+8 \text{ mA}=12 \text{ MA}$$

The conductor current 1, $I_{LOAD}$ is therefore plotted as follows onto an output current 2, $I_{OUT}$:

$$I_{OUT}=12 \text{ mA}+k*I_{LOAD/RMS}$$

insofar as $I_{LOAD}$ is an alternating current, or a direct current flowing in the positive direction, as represented in a first region A, and $$I_{OUT}=12 \text{ mA}-k*I_{LOAD/RMS}$$

insofar as $I_{LOAD}$ is a direct current flowing in the negative direction (see second region B).

The current transformer 100 according to the invention thus works in bipolar fashion for a direct current as the conductor current and at the same time it is able to indicate an effective value for an alternating current as the conductor current. The overall information (effective value and the sign in the case of direct current) is put out in an output signal and can thus be detected by a single analog/digital converter 20 of an automation control system 22.

Figure 3:
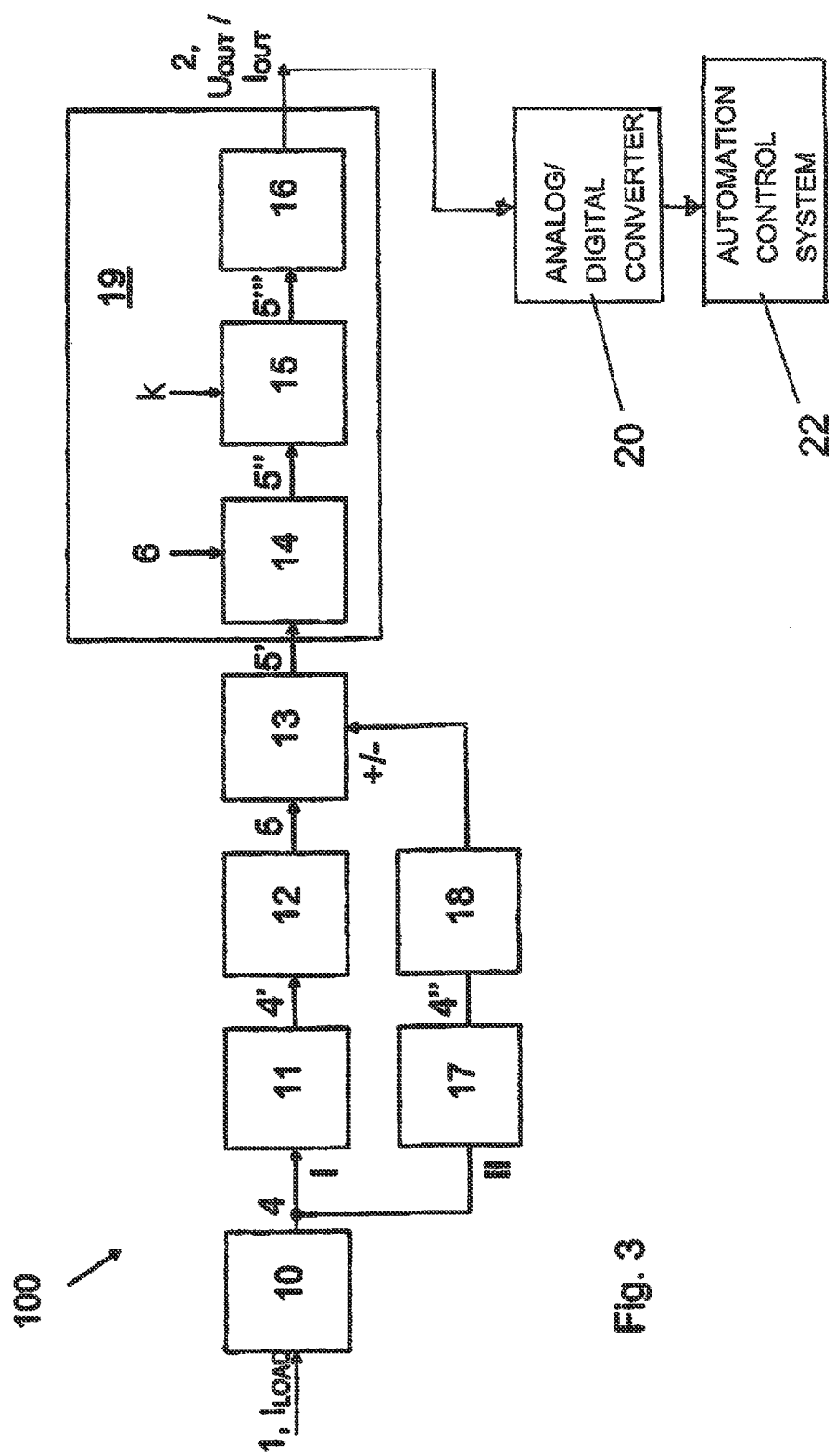
FIG. 3 is a block diagram illustrating the current transformer system of the present invention.

FIG. 3 shows the current transformer 100 schematically. It comprises here a Hall sensor 10 for detecting the conductor current 1, $I_{LOAD}$ as a current sensor. At the output of the Hall effect sensor 10 there is measured an output voltage 4, which is generated by the magnetic field in the Hall sensor 10 produced by the conductor current 1, $I_{LOAD}$. The output voltage 4 is a signed value. In an alternative embodiment, a shunt resistor can also be used as the current sensor, through which the conductor current 1, $I_{LOAD}$ flows. The voltage drop across the shunt resistor then represents the signed output voltage 4.

The current transformer 100 has two processing branches I, II arranged in parallel with each other.

In the first processing branch I there is provided a means 12 of calculating the effective value 5 of the output voltage 4 of the Hall sensor 10. In order to filter out interference signals, optionally a first frequency filter 11 is hooked up before the means 12 of calculating the effective value 5 of the output voltage 4, preferably being a low-pass filter with high cut-off frequency. The cut-off frequency of the first frequency filter 11 and/or its step response time are optionally adjustable. In this way, the user can choose whether the output signal 4' filtered in the first processing branch I will be used to detect essentially sinusoidal alternating currents, or also distorted alternating currents. Moreover, it can be provided that a time constant used in the means 12 for calculating the effective value 5 is adjustable. By selecting a short time constant, effective values can be put out with a high rate of variation, but then lower frequencies of the output voltage 4 will not be counted in the determination of the effective value. On the other hand, by selecting a longer time constant one can ensure that lower frequencies are also counted in the determination of the effective value, but the output of the effective value will respond correspondingly slowly to changes.

In the second processing branch II there is provided a means 18 for detecting the polarity +/− of the output voltage 4. The detected polarity is produced as a signal which is assigned the value of +1 or −1. The means 18 is configured such that the value +1 is produced for a (pure) alternating current as the conductor current 1. A second frequency filter 17 is connected in front of the means 18 for detecting the polarity +/− of the output voltage 4, which smooths out the output signal 4. In this way, the smoothed output signal 4" receives the sign of a direct current component contained in the conductor current 1, $I_{LOAD}$ and not the sign of an alternating current component contained in the conductor current 1, $I_{LOAD}$.

The effective value 5 calculated in the first processing branch I is multiplied with a factor of +1 or −1 in a multiplier 13, depending on the polarity +/− detected in the second processing branch II, for example, a factor of +1 when a positive polarity is detected and a factor of −1 when a negative polarity is detected.

The current transformer 100 is thus suitable not only for the detection of a pure alternating current as the conductor current 1, $I_{LOAD}$ or a pure direct current as the conductor current 1, $I_{LOAD}$. It is also suitable for detection of hybrid currents as the conductor current 1, $I_{LOAD}$, having both a direct current component and an alternating current component. For a pure alternating current as the conductor current 1, $I_{LOAD}$ the conductor current 1, $I_{LOAD}$ will be plotted in the first region A of the transfer characteristic 3 shown in FIG. 2.

In order to modify the signed effective value 5' in a suitable manner for the user, the current transformer 100 furthermore contains an output modifying circuit 19. The output modifying circuit 19 comprises an adder 14, which superimposes an offset value $I_{OUT/OFF}$ on the weighted effective value 5'. The superimposing of the offset value 6 and the magnitude of the offset value 6 are optionally adjustable by the user. Furthermore, the output circuit 19 comprises a means 15 of scaling the signed effective value 5" optionally superimposed with the offset value 6. The scaling factor k is also optionally adjustable by the user.

Furthermore, one can adjust whether the signed effective value 5''' optionally superimposed with the offset value 6 and/or scaled with the scaling factor k is produced in the form of an output current signal 2, $I_{OUT}$ or an output voltage signal 2, $U_{OUT}$. For this, the output circuit 19 comprises an output signal selecting circuit 16 which can be adapted by the user.

While in accordance with the provisions of the Patent Statutes the preferred forms and embodiments of the invention have been illustrated and described, it will be apparent to those skilled in the art that changes may be made without deviating from the invention described above.

What is claimed is:

1. A current transformer arrangement, comprising:
   (a) a current sensor having an input terminal connected with a conductor carrying a conductor input current, and an output terminal at which is produced a first output voltage that is proportional to the conductor input current;
   (b) a first processing branch including a voltage calculating device connected with said current sensor output terminal for calculating an effective voltage value of said first output voltage, said first processing branch having a first output terminal;
   (c) a second processing branch including a polarity detecting device having an input terminal connected with said current sensor output terminal, said second processing branch having a second output terminal at which a polarity signal is produced having:
       (1) a first polarity when the conductor input current is either an alternating current, a hybrid current, or a direct current flowing in one direction, and
       (2) a second polarity opposite to said first polarity when the conductor input current is a direct current flowing in the opposite direction; and
   (d) a multiplier device having a first input connected with said first processing branch first output terminal, and a second input terminal connected with said second processing branch second output terminal, said multiplier device being operable to modify said effective voltage value to produce a signed effective voltage value having a polarity corresponding with the polarity of said polarity signal.

2. The current transformer arrangement defined in claim 1, wherein said first processing branch includes a first low-pass frequency filter with high cut-off frequency, said first low-pass frequency filter being operable to filter high-frequency interference signals from said current sensor output voltage.

3. The current transformer arrangement as defined in claim 2, wherein said first low-pass frequency filter has an adjustable cut-off frequency.

4. The current transformer arrangement as defined in claim 2, wherein said first low-pass frequency filter has an adjustable step response time.

5. The current transformer arrangement as defined in claim 2, wherein said voltage calculating device has an adjustable time constant.

6. The current transformer arrangement defined in claim 2, wherein said second processing branch includes a second frequency filter operable to smooth out said current sensor output voltage, thereby to detect the sign of the direct current component of the conductor current input.

7. The current transformer arrangement defined in claim 1, and further including:
(e) an output modifying circuit for modifying said signed effective value voltage for use by the user.

8. The current transformer arrangement defined in claim 7, wherein said output modifying circuit includes an adder for superimposing an offset voltage upon said signed effective value voltage.

9. The current transformer arrangement defined in claim 7, wherein said output modifying circuit includes an adder for adding a scaling factor upon said signed effective voltage.

10. The current transformer arrangement defined in claim 7, wherein said output modifying circuit includes a signal selecting device for selecting either a current output signal or a voltage output signal.

11. The current transformer arrangement defined in claim 1, wherein said current sensor is a Hall effect sensor.

12. The current transformer arrangement defined in claim 1, wherein said current sensor is a shunt resistor.

13. The current transformer arrangement defined in claim 1, and further including an analog/digital converter connected with the output of said output modifying circuit for supplying a control signal to an automation control system.

14. A method for converting a conductor current flowing in an electrical conductor into an output signal, comprising the steps of:

(a) detecting the conductor current by means of a current transforming sensor to produce a sensor output voltage that is proportional to the conductor current;

(b) calculating by means of a calculating device the effective voltage value of said sensor output voltage;

(c) generating by means of a polarity detecting device a polarity signal as a function of the polarity of said sensor output voltage;

(d) multiplying said effective voltage value by means of a multiplying device with a positive or negative factor corresponding with the polarity of said sensor output voltage, thereby to produce a signed effective value; and (e) modifying said signed effective value by an output modifying circuit to produce a modified output signal corresponding with the sign of said signed effective value.

15. The method as defined in 14, and further including the step of scaling said signed effective value by a scaling device by a scaling factor.

16. The method as defined in claim 14, and further including the step of adding by an adder device an offset voltage to said signed effective value.

17. The method as defined in claim 14, and further including the step of applying said modified output signal to an automation control system.

18. The method as defined in claim 14, wherein said polarity signal has:
(1) a first polarity when said conductor current is a pure alternating current, a hybrid alternating current, or a direct current flowing in a first direction, and
(2) a second polarity opposite to said first polarity when said conductor current is a direct current flowing in the opposite direction.

* * * * *